United States Patent
Keum et al.

(10) Patent No.: US 6,903,336 B2
(45) Date of Patent: Jun. 7, 2005

(54) POLARITY EXCHANGER AND ION IMPLANTER HAVING THE SAME

(75) Inventors: Gyeong-Su Keum, Suwon (KR); Gum-Hyun Shin, Suwon (KR); Hyung-Sik Hong, Suwon (KR); Kyue-Sang Choi, Seoul (KR); Chung-Hun Park, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/730,998

(22) Filed: Dec. 10, 2003

(65) Prior Publication Data

US 2004/0113100 A1 Jun. 17, 2004

(30) Foreign Application Priority Data

Dec. 17, 2002 (KR) .................................. 10-2002-0080608

(51) Int. Cl.[7] ......................... H01J 37/08; H01J 37/313
(52) U.S. Cl. ............................. 250/292.2; 250/292.21; 250/251
(58) Field of Search ........................ 250/492.2, 492.21; 25/251

(56) References Cited

U.S. PATENT DOCUMENTS 5,959,305 A * 9/1999 Mack et al. ............ 250/492.21
6,462,331 B1 * 10/2002 Choi et al. ................. 250/251
6,639,230 B2 * 10/2003 Kwon .................... 250/492.21
2002/0050577 A1 5/2002 Cha

FOREIGN PATENT DOCUMENTS

KR 10-2002-0083601 11/2002

* cited by examiner

Primary Examiner—John R. Lee
Assistant Examiner—James J. Leybourne
(74) Attorney, Agent, or Firm—Lee, Sterba & Morse, P.C.

(57) ABSTRACT

A polarity exchanger and ion implanter include a stripping canal for passing an ion beam therethrough, a gas supply unit for providing a stripping gas into the stripping canal to change a polarity of the ion beam, a gas circulation unit for circulating the stripping gas, a flow meter for measuring a flow rate of the stripping gas, an ammeter for measuring a driving current applied to the gas circulation unit for operating the gas circulation unit, and a monitoring unit for generating a control signal to control a process for changing the polarity of the ion beam in accordance with the measured flow rate of the stripping gas and the measured driving current. The polarity exchanger and ion implanter having the polarity exchanger may prevent generation of metallic contaminants caused by a flow rate variation of the stripping gas or deterioration of a component of the gas circulation unit.

19 Claims, 4 Drawing Sheets

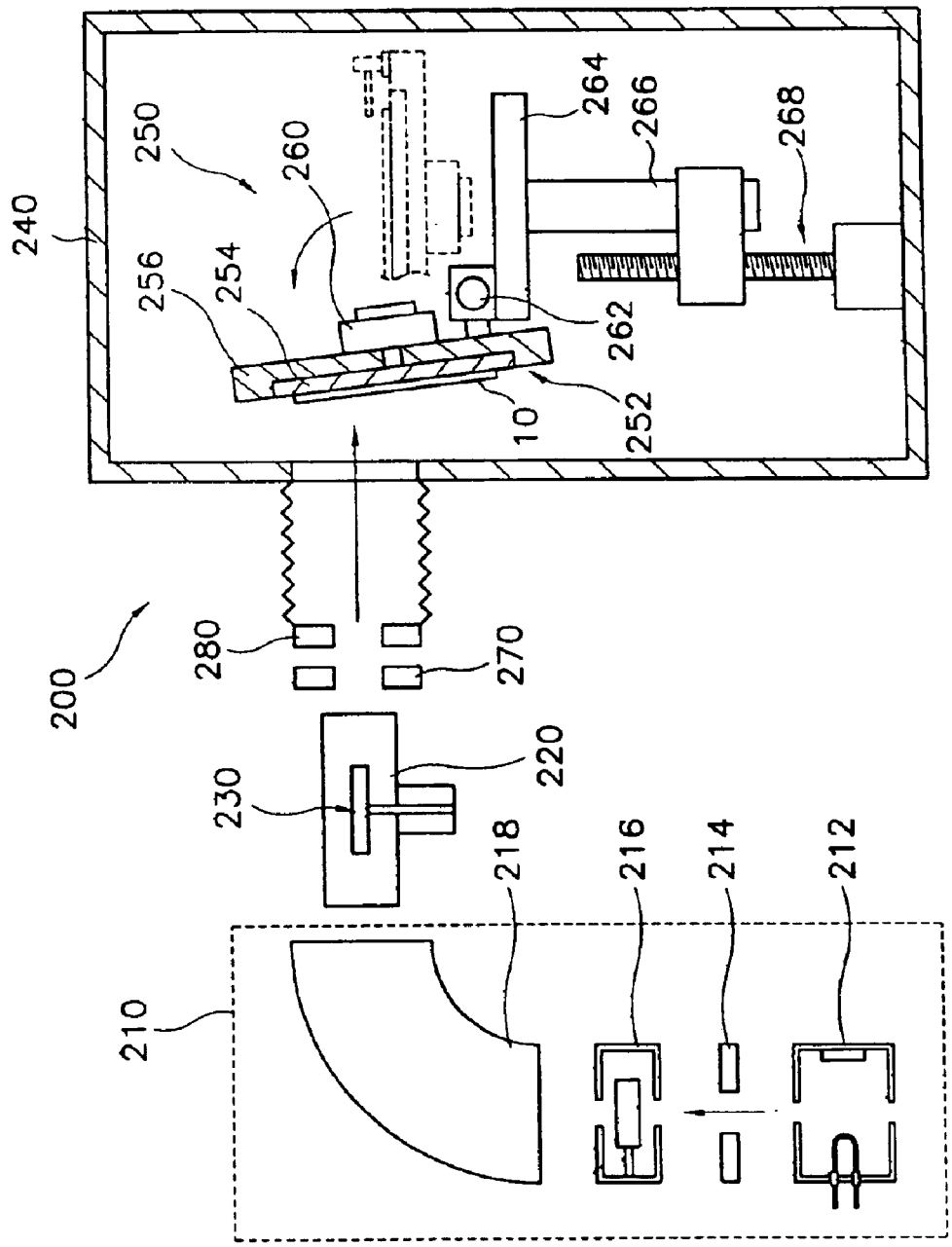

POLARITY EXCHANGER AND ION IMPLANTER HAVING THE SAME

BACKGROUND OF THE INVENTION

1. Field of the Invention

The present invention relates to a polarity exchanger and an ion implanter having the same. More particularly, the present invention relates to a polarity exchanger for changing a polarity of an ion beam in an accelerator for accelerating the ion beam and an ion implanter having the same.

2. Description of the Related Art

Generally, semiconductor devices are manufactured through a fabrication process for forming electric circuits on a silicon wafer serving as a semiconductor substrate, an inspection process for inspecting electrical characteristic of the electrical circuits, and a packaging process for individually packaging the electrical circuits using an epoxy resin.

The fabrication process includes a deposition step for forming a film on the substrate, a chemical mechanical polishing step for planarizing the film on the substrate, a photolithography step for forming a photoresist pattern on the film, an etching step for etching the film to form electrical patterns using the photoresist pattern, an ion implantation step for implanting ions into predetermined portions of the substrate, a cleaning step for removing impurities from the substrate, and an inspection step for inspecting a surface of the substrate where the electrical patterns are positioned, and the like.

Among the above unit steps, the ion implantation step is executed in order to form a source/drain region of a transistor by implanting ions into the predetermined portions of the substrate. It is very important that specific ions are uniformly implanted into the portions of the substrate to form the source/drain region during the ion implantation step. Ion implantation has an advantage over conventional thermal diffusion in that an amount and depth of ions implanted into the source/drain region of the transistor may be exactly adjusted to a desired amount and depth.

An apparatus for performing an ion implantation process generally includes an ion generator, an ion extractor, a first polarity exchanger, a mass spectrometer, an accelerator, a second polarity exchanger, a focusing lens and an ion implantation chamber.

Ions generated from the ion generator are converted into an ion beam by the ion extractor. The first polarity exchanger changes a polarity of the extracted ion beam such that a negative ion beam is formed. The mass spectrometer selects specific ions from the negative ion beam and directs a negative ion beam consisting of the selected negative ions into the accelerator. A high voltage is applied to electrodes disposed in series in the accelerator to generate a Coulomb force for accelerating the negative ion beam. The second polarity exchanger is disposed adjacent to a central portion of the accelerator to change the negative ion beam into a positive ion beam. The positive ion beam changed by the second polarity exchanger is accelerated by the accelerator. The accelerated positive ion beam is focused on a semiconductor substrate through the focusing lens.

The polarity exchanger typically includes a stripping canal disposed in the accelerator, a gas supply unit for providing a stripping gas used to change the negative ion beam into the positive ion beam, and a gas circulation unit for circulating the stripping gas provided into the stripping canal.

The gas supply unit includes a gas source for storing the stripping gas, a flow control valve and a gas supply pipe. The gas supply unit further includes a regulator for maintaining a constant pressure of the stripping gas. The regulator maintains the stripping gas at a pressure of about 175 psi. The flow control valve controls a flow rate of the stripping gas to be about 0.3 to about 0.4 sccm. The stripping gas includes a nitrogen gas or an argon gas.

The stripping gas provided into the stripping canal collides with the negative ion beam accelerated by the accelerator so that the negative ion beam is converted into the positive ion beam.

Meanwhile, the gas circulation unit is disposed between the stripping canal and the gas supply pipe to circulate the stripping gas provided into the stripping canal. The gas circulation unit circulates the stripping gas so that collisions between the stripping gas and the electrodes of the accelerator may be prevented, and metallic contaminants are not generated from the electrodes of the accelerator.

The gas circulation unit includes a gas circulation pipe for circulating the stripping gas, a vacuum pump for sucking the provided stripping gas into the stripping canal, a generator for applying power to operate the vacuum pump, a motor for operating the generator and a power source for operating the motor.

When the vacuum pump of the gas circulation unit begins to deteriorate during an ion implantation process employing the ion implantation apparatus, a driving current being applied to the vacuum pump may be augmented and a flow rate of the stripping gas may also be increased. The increase in flow rate of the stripping gas may cause a reduction in a polarity exchange rate and a transmission rate. Additionally, the stripping gas may collide with the electrodes of the accelerator as a circulation efficiency of the stripping gas is reduced. As a result, the aforementioned metallic contaminants are generated from the electrodes of the accelerator. Consequently, the semiconductor substrate may be polluted by the metallic contaminants, causing a failure in a semiconductor device.

SUMMARY OF THE INVENTION

In accordance with a feature of an embodiment of the present invention, there is provided a polarity exchanger including a stripping canal for passing an ion beam therethrough, a gas supply unit connected to the stripping canal for providing a stripping gas into the stripping canal to change a polarity of the ion beam while the ion beam passes through the stripping canal, a gas circulation unit connecting the stripping canal to the gas supply unit to circulate the stripping gas, a flow meter for measuring a flow rate of the stripping gas provided into the stripping canal, an ammeter for measuring a driving current applied to the gas circulation unit for operating the gas circulation unit, and a monitoring unit for generating a control signal to control a process for changing the polarity of the ion beam in accordance with a measured flow rate of the stripping gas and a measured driving current.

In the polarity exchanger, the gas supply unit may include a gas source for storing the stripping gas, a gas supply pipe connecting the stripping canal to the gas source, a flow control valve installed in the gas supply pipe for controlling the flow rate of the stripping gas provided into the stripping canal, and a driving member coupled to the flow control valve for opening and closing the flow control valve in accordance with the control signal.

The gas circulation unit may include a gas circulation pipe connecting the stripping canal to the gas supply unit, and a vacuum pump installed in the gas circulation pipe for circulating the stripping gas provided into the stripping canal through the gas circulation pipe.

The polarity exchanger may further include a generator coupled to the vacuum pump for applying the driving current to the vacuum pump, a motor for providing rotary power to the generator, a rotary shaft connecting the generator and the motor, and a power supply for applying power to the motor in accordance with the control signal.

The ammeter may be connected to a power line connecting the vacuum pump and the generator.

The monitoring unit may include a first comparator for comparing the measured flow rate of the stripping gas with a previously set reference flow rate in order to generate a first comparative signal, a second comparator for comparing the measured driving current with a previously set reference current in order to generate a second comparative signal, and a controller for generating the control signal in accordance with the first comparative signal and the second comparative signal.

The polarity exchanger may further include an alarm unit for generating an alarm signal in accordance with the control signal, and/or a lifting gate for blocking the ion beam, and a driving member for driving the lifting gate in accordance with the control signal, and/or a display unit for displaying the measured flow rate of the stripping gas and the measured driving current. The stripping gas preferably includes a nitrogen gas or an argon gas.

In accordance with another feature of an embodiment of the present invention, there is provided an ion implanter including an ion source for providing an ion beam, an accelerator for accelerating the ion beam, a polarity exchanger for changing a polarity of the ion beam while the ion beam passes through the accelerator, an ion implantation chamber for performing an ion implantation process on a substrate using the ion beam having a changed polarity, and a support unit installed in the ion implantation chamber for supporting the substrate, wherein the polarity exchanger includes a stripping canal installed in the accelerator for passing the ion beam therethrough, a gas supply unit coupled to the stripping canal for providing a stripping gas into the stripping canal to change the polarity of the ion beam while the ion beam passes through the stripping canal, a gas circulation unit connecting the stripping canal to the gas supply unit for circulating the stripping gas, a flow meter for measuring a flow rate of the stripping gas provided into the stripping canal, an ammeter for measuring a driving current applied to the gas circulation unit to operate the gas circulation unit, and a monitoring unit for generating a control signal to control a process for changing the polarity of the ion beam in accordance with a measured flow rate of the stripping gas and a measured driving current.

The ion beam provided from the ion source preferably has a negative polarity. The accelerator may include a plurality of first electrodes connected in series wherein a first voltage is applied to the first electrodes to accelerate the negative ion beam, and a plurality of second electrodes connected in series wherein a second voltage is applied to the second electrodes to accelerate a positive ion beam generated from the negative ion beam having a polarity changed by the polarity exchanger.

The ion implanter may further include a power source for applying the first and second voltages to the accelerator to accelerate the negative ion beam and the positive ion beam in accordance with the control signal. The ion implanter may further include a lift gate for blocking the ion beam provided into the accelerator, and a driving member for operating the lift gate in accordance with the control signal.

The gas supply unit may include a gas source for storing the stripping gas, a gas supply pipe connecting the stripping canal to the gas source, a flow control valve installed in the gas supply pipe for controlling the flow rate of the stripping gas provided into the stripping canal, and a driving member coupled to the flow control valve for opening and closing the flow control valve in accordance with the control signal.

The gas circulation unit may include a gas circulation pipe connecting the stripping canal to the gas supply unit, and a vacuum pump installed in the gas circulation pipe for circulating the stripping gas provided into the stripping canal through the gas circulation pipe.

Also, the ion implanter may include a generator coupled to the vacuum pump for applying the driving current to the vacuum pump, a motor for providing rotary power to the generator, a rotary shaft connecting the generator to the motor, and a power supply for applying power to the motor in accordance with the control signal.

The monitoring unit may include a first comparator for comparing the measured flow rate of the stripping gas with a previously set reference flow rate to generate a first comparative signal, a second comparator for comparing the measured driving current with a previously set reference current to generate a second comparative signal, and a controller for generating the control signal in accordance with the first comparative signal and the second comparative signal.

BRIEF DESCRIPTION OF THE DRAWINGS he above and other features and advantages of the present invention will become more apparent to those of ordinary skill in the art by describing in detail exemplary embodiments thereof with reference to the attached drawings in which:

FIG. 4 illustrates a schematic cross-sectional view of an ion implanter including the polarity exchanger as shown in FIG. 1.

DETAILED DESCRIPTION OF THE INVENTION

Figure 1:
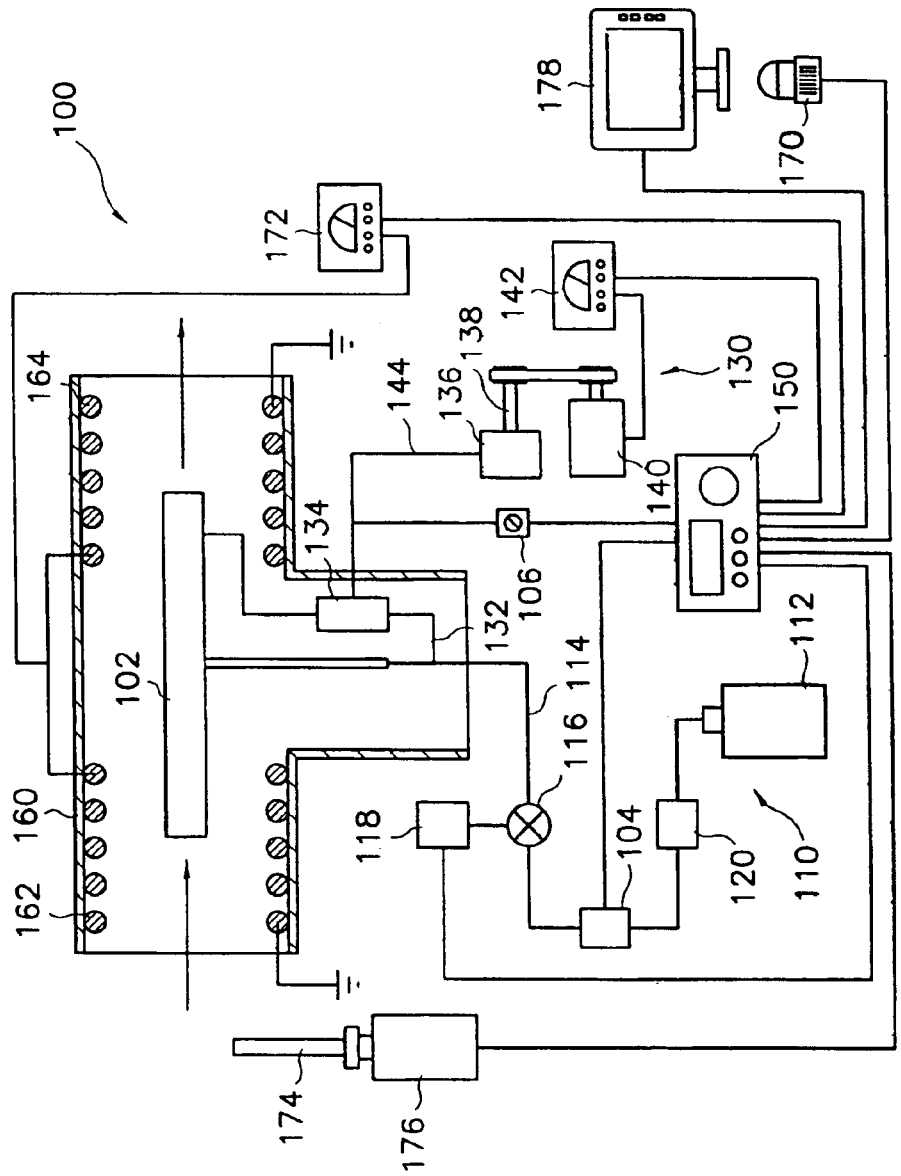
FIG. 1 illustrates a schematic cross-sectional view of a polarity exchanger according to an embodiment of the present invention.

Korean Patent Application No. 2002-80608, filed on Dec. 17, 2002, and entitled: "Polarity Exchanger and Ion Implanter Having the Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like reference numerals refer to like elements throughout.

Figure 2:
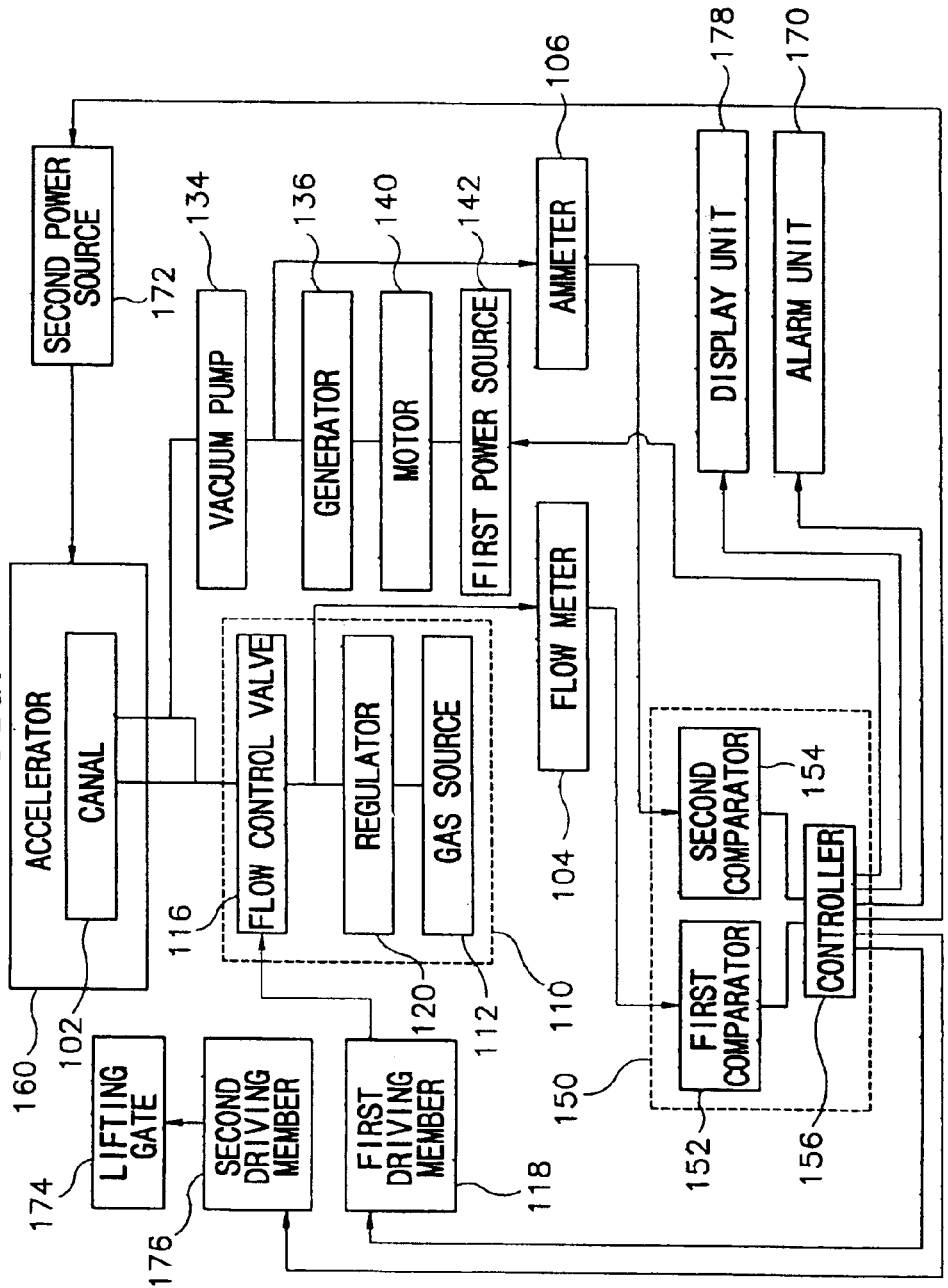
FIG. 2 illustrates a block diagram of a configuration of the polarity exchanger as shown in FIG. 1.

FIG. 1 illustrates a schematic cross-sectional view of a polarity exchanger according to an embodiment of the present invention. FIG. 2 illustrates a block diagram of a configuration of the polarity exchanger in FIG. 1.

Referring to FIGS. 1 and 2, a polarity exchanger 100 includes a stripping canal 102, a gas supply unit 110, a gas circulation unit 130, a flow meter 104, an ammeter 106 and a monitoring unit 150.

The stripping canal 102 is disposed in an accelerator 160 for accelerating an ion beam along a central axis of the accelerator 160. A negative (−) ion beam is directed into the accelerator 160, and then the negative ion beam is converted into a positive (+) ion beam using a stripping gas in the stripping canal 102. In FIG. 1, an arrow indicates an advance direction of the ion beam.

The gas supply unit 110 is connected to the stripping canal 102 to provide the stripping gas, which used to change the polarity of the ion beam, into the stripping canal 102. The gas supply unit 110 includes a gas source 112, a gas supply pipe 114, a flow control valve 116 and a first driving member 118.

The gas source 112 stores the stripping gas, and the gas supply pipe 114 connects the gas source 112 to the stripping canal 102. The flow control valve 116 is installed in the gas supply pipe 114 to control a flow rate of the stripping gas being provided into the stripping canal 102. The first driving member 118 opens and closes the flow control valve 116.

The gas supply unit 110 additionally includes a regulator 120 for maintaining a constant pressure of the stripping gas. The regulator 120 maintains the pressure of the stripping gas at about 175 psi.

The flow meter 104 is disposed in the gas supply pipe 114 between the flow control valve 116 and the regulator 120. The flow meter 104 measures the flow rate of the stripping gas provided into the stripping canal 102. An example of the flow meter 104 is a mass flow meter (MFM). However, other configurations may be used for the flow meter 104.

The gas circulation unit 130 connects the stripping canal 102 to the gas supply pipe 114 and circulates the stripping gas provided into the stripping canal 102. The gas circulation unit 130 includes a gas circulation pipe 132 and a vacuum pump 134 installed in the gas circulation pipe 132.

The gas circulation pipe 132 connects the stripping canal 102 to the gas supply pipe 114 and the vacuum pump 134 sucks the stripping gas provided into the stripping canal 102 through the gas circulation pipe 132.

The vacuum pump 134 is coupled to a generator 136 by a power line 144. The generator 136 applies a driving current to the vacuum pump 134 in order to operate the vacuum pump 134. The generator 136 is coupled to a motor 140 through a rotary shaft 138. The motor 140 and the rotary shaft 138 are connected by a pair of pulleys and belts. The motor 140 provides rotary power to the generator 136 to drive the generator 136. The motor 140 is also coupled to a first power source 142.

The ammeter 106 is connected to the power line 144 between the vacuum pump 134 and the generator 136.

The monitoring unit 150 includes a first comparator 152, a second comparator 154 and a controller 156.

The first comparator 152 compares a measured flow rate of the stripping gas with a previously set reference flow rate of the stripping gas and generates a first comparative signal. The second comparator 154 compares a measured driving current with a previously set reference current and generates a second comparative signal. The controller 156 generates a control signal in accordance with the first and second comparative signals in order to control a process for changing the polarity of the ion beam.

The first comparative signal indicates a difference between the measured flow rate of the stripping gas and the reference flow rate of the stripping gas. The second comparative signal represents a difference between the measured driving current and the reference current. When the first comparative signal is larger than a first limit value, the controller 156 stops the performance of the polarity exchanger 100. Additionally, when the second comparative signal is greater than a second limit value, the controller 156 stops the performance of the polarity exchanger 100.

The first driving member 118 operates the flow control valve 116 according to the control signal generated from the controller 156. When the control signal indicates that either the first or second comparative signal is greater than the respective first or second limit value, the flow control valve 116 blocks the gas supply pipe 114 so that the stripping gas is not provided into the stripping canal 102. Similarly, the first power source 142 does not apply the driving current to the motor 140 when the control signal indicates that either the first or second comparative signal is greater than the respective first or second limit value. Accordingly, the vacuum pump 134 and the generator 136 no longer operate.

Meanwhile, an alarm unit 170 is connected to the controller 156 to generate an alarm signal. The alarm unit 170 generates the alarm signal in accordance with the control signal produced from the controller 156. That is, when the control signal indicates that either the first or second comparative signal is greater than the respective first or second limit value and operation of the polarity exchanger 100 is to be stopped, the alarm unit 170 generates a signal to activate an alarm lamp or an alarm bell, one or both of which are provided in the alarm unit 170.

The stripping canal 102 is disposed in the accelerator 160 to accelerate the ion beam. A plurality of connected electrodes 162 and 164 are installed in the accelerator 160 along a central axis thereof. A high voltage is applied to the electrodes 162 and 164 so that the electrodes 162 and 164 accelerate the ion beam. The negative ion beam directed into the accelerator 160 is accelerated by a plurality of first electrodes 162 while a positive ion beam converted from the negative ion beam in the stripping canal 102 is accelerated by a plurality of second electrodes 164. When the negative ion beam passes through the stripping canal 102, negative ions of the negative ion beam collide with the stripping gas provided therein, thereby losing their outer electrons and becoming positive ions. The polarity of the negative ion beam is thus changed.

Figure 3:
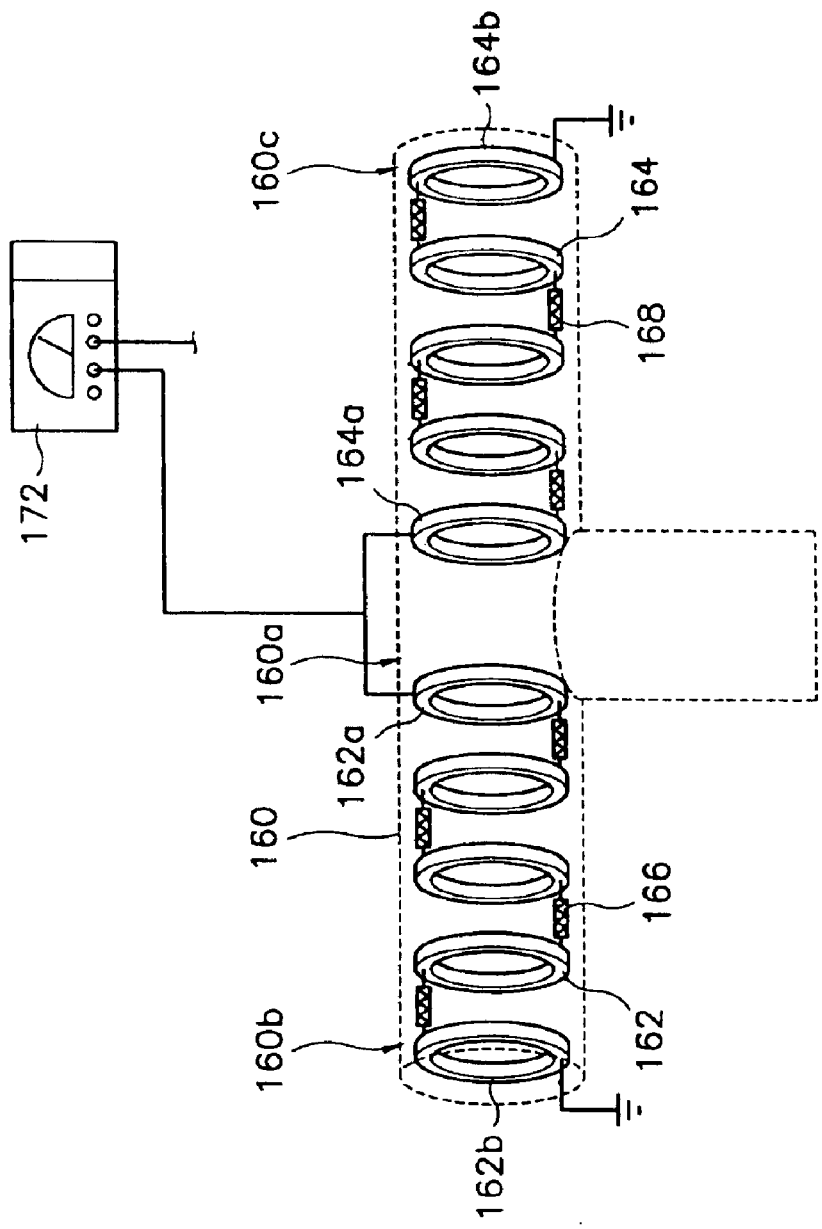
FIG. 3 illustrates a schematic perspective view of first and second electrodes of an accelerator as shown in FIG. 1.

FIG. 3 illustrates a schematic perspective view of the first electrodes 162 and the second electrodes 164 of the accelerator in FIG. 1.

Referring to FIG. 3, the first and second electrodes 162 and 164, respectively, have circular ring shapes. The first electrodes 162 are arranged from a central portion 160a of the accelerator 160 towards a first end portion 160b of the accelerator 160 where the negative ion beam is introduced. The first electrodes 162 are connected with each other in series, and each one of a plurality of first resistances 166 is respectively connected between each adjacent first electrode 162. The second electrodes 164 are arranged from the central portion 160a of the accelerator 160 towards a second end portion 160c of the accelerator 160 where the positive ion beam is emitted. The second electrodes 163 are connected with each other in series, and each one of a plurality of second resistances 168 is respectively connected between each adjacent second electrode 163.

A high voltage of about 650 kV is applied to an inner first electrode 162a and an inner second electrode 164a, which are adjacent to the central portion 160a of the accelerator 160. At this time, a sulfur hexafluoride (SF$_6$) gas having a pressure of about 105 psi fills the accelerator 160 in order to stably maintain the high voltage applied to the first and second electrodes 162 and 164. An outer first electrode 162b adjacent to the first end portion 160b of the accelerator 160 is grounded and an outer second electrode 164b adjacent to the second end portion 160c of the accelerator 160 is also grounded. Negative ions introduced through the first end portion 160b are accelerated using the first electrodes 162. Then, after the polarity of the negative ions is changed using the polarity exchanger 100 of FIG. 1, the resulting positive ions are accelerated using the second electrodes 164.

Referring again to FIGS. 1 and 2, a second power source 172 applies a voltage to the accelerator 160 in response to the control signal generated from the controller 156.

A lifting gate 174 and a second driving member 176 are installed adjacent to the accelerator 160. The second driving member 176 operates the lifting gate 174 in response to the control signal generated from the controller 156. When lifted by the second driving member 176, the lifting gate 174 blocks the negative ions from being introduced into the accelerator 160.

When the vacuum pump 134 for circulating the stripping gas provided into the stripping canal 102 deteriorates, the performance of the vacuum pump 134 is reduced and the driving current is augmented in order to operate the vacuum pump 134. Also, the flow rate of the stripping gas increases, and, if left unchecked, the stripping gas collides with the electrodes 162 and 164 in the accelerator 160 causing the generation of metallic contaminants. However, in the present invention, the controller 156 of the monitoring unit 150 generates a control signal in accordance with the measured driving current and the measured flow rate of the stripping gas. Thus, when the measured driving current and the measured flow rate of the stripping gas increase, the controller 156 generates a signal to stop operation of the polarity exchanger 100. In response to the signal generated by the controller 156, the first driving member 118 closes the flow control valve 116 and the second driving member 176 blocks the negative ion beam by moving the lifting gate 174. Also, the first power source 142 does not apply the voltage to the motor 140 and the second power source 172 no longer provides the voltage to the accelerator 160. In addition, the alarm unit 170 generates the alarm signal.

In a case that the flow rate of the stripping gas is abnormally augmented, i.e., not in response to operation of the vacuum pump 134, the monitoring unit 150 generates a control signal in accordance with the measured flow rate of the stripping gas, thereby stopping performance of the polarity exchanger 100.

Meanwhile, a display unit 178 is coupled to the monitoring unit 150. The display unit 178 displays the measured flow rate of the stripping gas, the measured driving current, the first comparative signal and the second comparative signal.

The stripping gas preferably includes an inert gas such as an argon gas or a nitrogen gas.

According to the present embodiment, when the vacuum pump 134 deteriorates, or the flow rate of the stripping gas is abnormally varied, metallic contaminants due to the stripping gas are not generated because operation of the polarity exchanger 100 is stopped.

FIG. 4 illustrates a schematic cross-sectional view of an ion implanter including the polarity exchanger of FIG. 1.

Referring to FIG. 4, an ion implanter 200 includes an ion source 210, an accelerator 220, a first polarity exchanger 230, an ion implantation chamber 240 and a support unit 250.

The ion source 210 provides an ion beam and the accelerator 220 accelerates the ion beam generated from the ion source 210. The first polarity exchanger 230 changes a polarity of the ion beam passing through the accelerator 220. An ion implantation process is performed in the ion implantation chamber 240. The support unit 250 supports a substrate 10 during the ion implantation process.

The ion source 210 has an ion generator 212, an ion extractor 214, a second polarity exchanger 216 and a mass spectrometer 218.

The ion generator 212 generates ions from a source gas and the ion extractor 214 forms the ion beam by extracting the ions from the ion generator 212. The second polarity exchanger 216 changes the polarity of the ion beam from positive to negative, and the mass spectrometer 218 selects specific ions from the negative ion beam.

The ion generator 212 may be an arc discharge type including an arc chamber and a filament. Thermal electrons emitted from the filament collide with the source gas to generate the ions. Alternatively, the ion generator 212 may be a radio frequency duoplasmatron type, a cold cathode type, a sputter type or penning ionization type.

The second polarity exchanger 216 includes solid phase magnesium and a heater. The solid phase magnesium serves as a donor that provides electrons. When the heater provides a heat of about 450° C. to the solid phase magnesium, vapor phase magnesium molecules escape from the solid phase magnesium to collide with the extracted ions. Upon colliding, the ions gain electrons of the magnesium molecules, thereby gaining negative polarity.

The mass spectrometer 218 selects the specific ions having the negative polarity from the ion beam, and the specific ions are introduced into the accelerator 220.

In the present embodiment, constructions of the accelerator 220 and the first polarity exchanger 230 are identical to those of the accelerator 160 and the polarity exchanger 100 in FIG. 1.

The support unit 250 is disposed in the ion implantation chamber 240 in order to support the substrate 10. The support unit 250 includes a chuck 252 for supporting the substrate 10 and a plurality of driving members for operating the chuck 252.

The chuck 252 has a platen 254 for holding the substrate 10 with an electrostatic force and a support member 256 for supporting the platen 254. The platen 254 has a disc shape.

A third driving member 260 is coupled to the platen 254 through the support member 256 to rotate the platen 254. The third driving member 260 is disposed on a rear face of the support member 256. Additionally, a fourth driving member 262 is coupled to the rear face of the support member 256 in order to adjust an inclined angle of the substrate 10. The fourth driving member 262 is disposed on a base plate 264. A driving shaft 266 and a fifth driving member 268 are coupled to a rear face of the base plate 264 to move the chuck 252 in a vertical direction.

The third driving member 260 and the fourth driving member 262 include motors, preferably, step motors capable of adjusting a rotation angle of the substrate 10, respectively. The fifth driving member 268 includes a motor for providing a rotary power, a ball screw and a ball nut. Alternatively, constructions of the third to fifth driving members 260, 262 and 268 may be variously modified.

The substrate 10 is horizontally loaded on the chuck 252 and unloaded from the chuck 252. When the ion implantation process is executed concerning the substrate 10, the substrate 10 is positioned on the chuck 252 by a predetermined inclined angle, such as an angle of about 7° with respect to the vertical direction. The third driving member 260 rotates the substrate 10 in order to prevent a shadow effect caused by patterns formed on the substrate 10 during the ion implantation process.

Though a single wafer type support unit 250 is installed in the ion implantation chamber 240 in FIG. 4, a rotary disc may be alternatively installed in the ion implantation chamber 240 for simultaneously supporting a plurality of substrates.

The ion implanter 200 additionally includes a focusing lens 270 and an ion filter 280.

The focusing lens 270 focuses the positive ion beam accelerated by the accelerator 220 onto the substrate 10 and the ion filter 280 selects positive ions having a specific energy level. Though it is not shown in FIG. 4, the ion implanter 200 may additionally include an ion deflector for entirely scanning the substrate 10 by adjusting a propagation direction of the positive ion beam.

The positive ion beam converted by the first polarity exchanger 230 includes positive ions having various energy levels and a stripping gas having an ion phase. The ion filter 280 selects the positive ions having the specific energy level and removes the stripping gas having the ion phase from the positive ion beam.

The ion implanter 200 may prevent deterioration of the vacuum pump of the first polarity exchanger 230 and/or generation of metallic contaminants caused by a variation of a flow rate of the stripping gas. Namely, in the manner described above with respect to FIGS. 1–3, the ion implanter 200 controls a performance of the first polarity exchanger 230 in accordance with the measured driving current of the vacuum pump and the measured flow rate of the stripping gas, thereby preventing the generation of metallic contaminants.

According to the present invention, the polarity exchanger measures the flow rate of the stripping gas and the driving current of the vacuum pump. The monitoring unit controls the performance of the polarity exchanger in accordance with the measured flow rate of the stripping gas and the measured driving current. Therefore, generation of metallic contaminants may be reduced, and contamination of the substrate due to metallic contaminants may be prevented.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A polarity exchanger, comprising:
    a stripping canal for passing an ion beam therethrough;
    a gas supply unit connected to the stripping canal for providing a stripping gas into the stripping canal to change a polarity of the ion beam while the ion beam passes through stripping canal;
    a gas circulation unit connecting the stripping canal to the gas supply unit to circulate the stripping gas;
    a flow meter for measuring a flow rate of the stripping gas provided into the stripping canal;
    an ammeter for measuring a driving current applied to the gas circulation unit for operating the gas circulation unit; and
    a monitoring unit for generating a control signal to control a process for changing the polarity of the ion beam in accordance with a measured flow rate of the stripping gas and a measured driving current.

2. The polarity exchanger as claimed in claim 1, wherein the gas supply unit comprises:
    a gas source for storing the stripping gas;
    a gas supply pipe connecting the stripping canal to the gas source;
    a flow control valve installed in the gas supply pipe for controlling the flow rate of the stripping gas provided into the stripping canal; and
    a driving member coupled to the flow control valve for opening and closing the flow control valve in accordance with the control signal.

3. The polarity exchanger as claimed in claim 1, wherein the gas circulation unit comprises:
    a gas circulation pipe connecting the stripping canal to the gas supply unit; and
    a vacuum pump installed in the gas circulation pipe for circulating the stripping gas provided into the stripping canal through the gas circulation pipe.

4. The polarity exchanger as claimed in claim 3, further comprising:
    a generator coupled to the vacuum pump for applying the driving current to the vacuum pump;
    a motor for providing rotary power to the generator;
    a rotary shaft connecting the generator and the motor; and
    a power supply for applying power to the motor in accordance with the control signal.

5. The polarity exchanger as claimed in claim 4, wherein the ammeter is connected to a power line connecting the vacuum pump and the generator.

6. The polarity exchanger as claimed in claim 1, wherein the monitoring unit comprises:
    a first comparator for comparing the measured flow rate of the stripping gas with a previously set reference flow rate in order to generate a first comparative signal;
    a second comparator for comparing the measured driving current with a previously set reference current in order to generate a second comparative signal; and
    a controller for generating the control signal in accordance with the first comparative signal and the second comparative signal.

7. The polarity exchanger as claimed in claim 1, further comprising:
    an alarm unit for generating an alarm signal in accordance with the control signal.

8. The polarity exchanger as claimed in claim 1, further comprising:
    a lifting gate for blocking the ion beam; and
    a driving member for driving the lifting gate in accordance with the control signal.

9. The polarity exchanger as claimed in claim 1, further comprising:
    a display unit for displaying the measured flow rate of the stripping gas and the measured driving current.

10. The polarity exchanger as claimed in claim 1, wherein the stripping gas includes a nitrogen gas or an argon gas.

11. An ion implanter, comprising:
    an ion source for providing an ion beam;
    an accelerator for accelerating the ion beam;
    a polarity exchanger for changing a polarity of the ion beam while the ion beam passes through the accelerator;

an ion implantation chamber for performing an ion implantation process on a substrate using the ion beam having a changed polarity; and a support unit installed in the ion implantation chamber for supporting the substrate, wherein the polarity exchanger includes:

a stripping canal installed in the accelerator for passing the ion beam therethrough;

a gas supply unit coupled to the stripping canal for providing a stripping gas into the stripping canal to change the polarity of the ion beam while the ion beam passes through the stripping canal;

a gas circulation unit connecting the stripping canal to the gas supply unit for circulating the stripping gas;

a flow meter for measuring a flow rate of the stripping gas provided into the stripping canal;

an ammeter for measuring a driving current applied to the gas circulation unit to operate the gas circulation unit; and a monitoring unit for generating a control signal to control a process for changing the polarity of the ion beam in accordance with a measured flow rate of the stripping gas and a measured driving current.

12. The ion implanter as claimed in claim 11, wherein the ion beam provided from the ion source has a negative polarity.

13. The ion implanter as claimed in claim 12, wherein the accelerator comprises:

a plurality of first electrodes connected in series wherein a first voltage is applied to the first electrodes to accelerate the negative ion beam; and a plurality of second electrodes connected in series wherein a second voltage is applied to the second electrodes to accelerate a positive ion beam generated from the negative ion beam having a polarity changed by the polarity exchanger.

14. The ion implanter as claimed in claim 13, further comprising:

a power source for applying the first and second voltages to the accelerator to accelerate the negative ion beam and the positive ion beam, respectively, in accordance with the control signal.

15. The ion implanter as claimed in claim 11, further comprising:

a lift gate for blocking the ion beam provided into the accelerator; and a driving member for operating the lift gate in accordance with the control signal.

16. The ion implanter as claimed in claim 11, wherein the gas supply unit comprises:

a gas source for storing the stripping gas;

a gas supply pipe connecting the stripping canal to the gas source;

a flow control valve installed in the gas supply pipe for controlling the flow rate of the stripping gas provided into the stripping canal; and a driving member coupled to the flow control valve for opening and closing the flow control valve in accordance with the control signal.

17. The ion implanter as claimed in claim 11, wherein the gas circulation unit comprises:

a gas circulation pipe connecting the stripping canal to the gas supply unit; and a vacuum pump installed in the gas circulation pipe for circulating the stripping gas provided into the stripping canal through the gas circulation pipe.

18. The ion implanter as claimed in claim 17, further comprising:

a generator coupled to the vacuum pump for applying the driving current to the vacuum pump;

a motor for providing rotary power to the generator;

a rotary shaft connecting the generator to the motor; and a power supply for applying power to the motor in accordance with the control signal.

19. The ion implanter as claimed in claim 11, wherein the monitoring unit comprises:

a first comparator for comparing the measured flow rate of the stripping gas with a previously set reference flow rate to generate a first comparative signal;

a second comparator for comparing the measured driving current with a previously set reference current to generate a second comparative signal; and a controller for generating the control signal in accordance with the first comparative signal and the second comparative signal.

* * * * *